(12) United States Patent
Greed

(10) Patent No.: US 7,852,175 B2
(45) Date of Patent: Dec. 14, 2010

(54) CIRCUIT BOARD DEFINED BY TRANSMISSION LINE PATTERNS DISPOSED WITHIN TRENCHES AND COVERED BY A CONFORMAL LAYER

(75) Inventor: Robert Brian Greed, Colchester (GB)

(73) Assignee: BAE Sysytems PLC, London (GB)

( * ) Notice: Subject to any disclaimer, the term of this patent is extended or adjusted under 35 U.S.C. 154(b) by 807 days.

(21) Appl. No.: 11/596,559

(22) PCT Filed: Jun. 14, 2006

(86) PCT No.: PCT/GB2006/050153

§ 371 (c)(1),
(2), (4) Date: Nov. 14, 2006

(87) PCT Pub. No.: WO2006/134399

PCT Pub. Date: Dec. 21, 2006

(65) Prior Publication Data

US 2009/0033443 A1    Feb. 5, 2009

(30) Foreign Application Priority Data

Jun. 15, 2005  (EP) ................................. 05270022
Jun. 15, 2005  (GB) ................................. 0512118.1

(51) Int. Cl.
*H01P 3/08*    (2006.01)
*H01P 1/10*    (2006.01)
(52) U.S. Cl. ...................... 333/246; 333/262
(58) Field of Classification Search .............. 333/238, 333/246, 105, 262
See application file for complete search history.

(56) References Cited

U.S. PATENT DOCUMENTS

| 3,771,070 | A | | 11/1973 | Gaudio |
| 4,575,700 | A | * | 3/1986 | Dalman ...................... 333/238 |
| 5,227,742 | A | * | 7/1993 | Suzuki .......................... 333/1 |
| 5,369,881 | A | | 12/1994 | Inaba et al. |
| 5,652,557 | A | * | 7/1997 | Ishikawa ..................... 333/243 |
| 6,433,408 | B1 | | 8/2002 | Anjo et al. |
| 6,621,384 | B1 | | 9/2003 | Handforth et al. |
| 6,888,427 | B2 | * | 5/2005 | Sinsheimer et al. ......... 333/238 |
| 2003/0137053 | A1 | | 7/2003 | Okayama |
| 2004/0113725 | A1 | * | 6/2004 | Ma et al. ..................... 333/238 |
| 2005/0012572 | A1 | * | 1/2005 | Ida et al. ..................... 333/238 |

FOREIGN PATENT DOCUMENTS

JP    10-163710       6/1998
WO    01/95425 A1    12/2001

* cited by examiner

*Primary Examiner*—Benny Lee
(74) *Attorney, Agent, or Firm*—Buchanan Ingersoll & Rooney PC

(57) ABSTRACT

A circuit board is provided, and a method for manufacturing the same, suitable for use in high frequency circuits, and comprising a planar pattern of transmission line conductors for linking components formed on or within the circuit board, the transmission line conductors being formed within a corresponding pattern of trenches arranged so that the conductors lie beneath a finished surface of the circuit board which is polished flat to permit one or more cover boards to be bonded thereto.

16 Claims, 5 Drawing Sheets

CIRCUIT BOARD DEFINED BY TRANSMISSION LINE PATTERNS DISPOSED WITHIN TRENCHES AND COVERED BY A CONFORMAL LAYER

FIELD

This invention relates to transmission lines and in particular, but not exclusively, to embedded transmission lines for use in circuit boards designed for high frequency signals. High frequency signals are hereby defined as those having microwave, millimetric or sub-millimetric wavelengths.

BACKGROUND

It is known to provide a transmission line in the form of a so-called stripline, created by sandwiching a conductor between two conducting ground planes. Striplines are used in particular in the manufacture of compliant printed circuit boards (PCBs) in which the circuit required is patterned onto one face of a compliant substrate. A second unpatterned board of a similar compliant substrate is then bonded to the first using an electrically compatible bonding film which flows around the conductor pattern to create an homogeneous filling, i.e. one with no voids remaining.

To achieve more compact circuit board designs, high dielectric constant materials such as alumina, silicon, sapphire, gallium arsenide or gallium nitride may be used to construct the boards. However, such materials are generally rigid. If a stripline circuit pattern is formed on the surface of one rigid board and a second rigid board is bonded to the first in a similar manner to that for compliant boards, air filled voids are often created between the boards which degrade the electrical performance of the circuit. Bonding films and other adhesives do not in this case provide a solution since the dielectric constant of these materials is low compared to that of the material used to make the boards themselves.

There are a number of known arrangements for packaging high frequency devices. These may involve assembling each device into a ceramic package, for example, with tungsten wire feed-throughs to the device inside. Post-assembly lids are welded or otherwise adhesively attached to complete the package. In particular, it is known to mount high frequency devices on a circuit board and to interconnect them by stripline conductors patterned on the surface of the board. Each device may be individually packaged by bonding a cavitated lid to the board, under a vacuum, to cover the device. However, each lid must be bonded to the circuit board in such a way as to ensure a hermetic seal so that the vacuum under the lid is preserved. Typically, bonding is achieved using epoxies as they flow around the conductors to form a hermetic seal. However, where small volume vacuum sealing is needed, epoxies cannot be used as they out-gas into the package, over time, thus spoiling the vacuum. Similar problems can occur with soldered joints and glass frit joints.

Of necessity, high frequency stripline conductors are 'thicker' than conductors for use with lower frequency signals. This makes it difficult to achieve a good seal when bonding a lid over high frequency stripline conductors patterned onto the surface of a circuit board. Epoxies and glass frit seals tend not to flow-fill around the conductors, thus forming imperfect seals. To overcome this problem, schemes using conductor feed-throughs to the reverse side of a package are used by a number of manufacturers. This approach introduces further problems in sealing the feed-through. The approach also limits high performance to the lower microwave frequencies and below. Furthermore, where a number of separate lids are used to cover devices on a single circuit, then a second buried circuit layer becomes necessary to interconnect the feed-throughs to the reverse side of the board. This adds to fabrication complexity and degrades performance.

SUMMARY

From a first aspect, the present invention resides in a high frequency circuit comprising a circuit board and at least one cover board bonded to the circuit board, wherein the circuit board comprises a base substrate of a substantially rigid dielectric material having a signal-side surface and a surface on which is formed a conducting ground plane, wherein beneath the signal-side surface of the base substrate a planar pattern of one or more transmission line conductors is disposed within a corresponding pattern of trenches formed within the base substrate, so enabling a substantially flat signal-side surface to be provided on the circuit board to which said at least one cover board is bonded.

Conveniently, the use of trenches ensures that the conductors lie beneath the finished surface of the circuit board and in a single plane, so avoiding the need for vias and other types of link used in prior art arrangements to interconnect different levels of conductor and which can lead to degraded electrical performance of the circuit.

In a preferred embodiment of the present invention, the circuit board further comprises one or more electrical components formed on or within the signal side of the circuit board, electrically connected by means of at least one of the entrenched transmission line conductors. Electrical components may be active or passive components, for example resistors, capacitors, inductors, filters, or integrated circuits in themselves, or devices such as switches.

In a preferred embodiment, the signal-side surface comprises a conformal layer of insulating material deposited to cover the planar pattern of entrenched transmission line conductors. This layer may be machined and polished to a substantially flat surface for bonding cover boards over electrical components formed on or within the signal-side surface of the board.

Preferably, electrical connection to an electrical component formed on the surface of the conformal layer is made through an access window formed in the conformal layer above a section of entrenched transmission line conductor. Where an electrical component protrudes above the surface of the circuit board a respective cover board may comprise a cavity formed to accommodate the protruding portion of the component.

Using circuits according to preferred embodiments of the present invention, stripline circuits may be fabricated in high dielectric constant materials to achieve high levels of miniaturisation without the degradation in performance associated with circuits fabricated according to some of the prior art fabrication techniques. Moreover, circuits according to the present invention provide for an efficient and cost effective packaging scheme for electrical devices mounted on or substantially within a circuit board. Conventional packaging technologies involve metal or ceramic packages. These packages are generally proprietary and come in fixed sizes and with fixed, sealed, feed-through connections to the components inside. Known techniques for packaging a device involve bonding a cavitated lid over a conductor pattern formed on the surface of a circuit board. However, to achieve a good seal, the conductor pattern, where it passes under the lid wall, has to be made very thin. This increases the signal loss. It is also possible for unwanted air filled voids to form adjacent to the conductors which can lead to the generation of unwanted modes of propagation and degrade performance of the circuit. In particular, micro-electro-mechanical systems (MEMS) components or circuits are inherently very low loss devices. Losses arising where the conductors run under the wall of a covering lid in prior art arrangements can be greater than the losses in the MEMS component or circuit being packaged, so diminishing the benefits of using MEMS technology.

Preferred embodiments of the present invention overcome such limitations in prior art packaging techniques through the use of entrenched transmission line conductors. Device packaging may be carried out as part of the circuit fabrication process. There are no restrictions on size of a package (cover board) or the positions of the input and output interconnects to the component or components to be packaged. Constraints imposed by proprietary components are eliminated. The conductors can be made as thick as required to achieve very low loss, much smaller by comparison to the loss of the packaged component. The sealing face of a circuit is flat and thus sealing materials do not have to compensate for a difference in conductor and substrate face heights or to flow-fill around the conductor. Conductor feed-throughs to the reverse side of a component and buried interconnect layers required in certain prior art arrangements can be eliminated. Interconnections lying in one plane improve performance at all frequencies, but particularly at microwave and higher frequencies. The packaging potential for circuits according to the present invention extends from individual components to whole circuits. Within a single integrated circuit, components can, if required, be separately packaged to provide vacuum or controlled back-filled local environments.

From a second aspect, the present invention lies in a method of manufacturing a circuit board for use in a high frequency circuit, the method comprising the steps of:

(i) in a signal-side surface of a wafer of a substantially rigid base substrate dielectric material, forming a pattern of trenches corresponding to a planar pattern of transmission line conductors;
(ii) depositing at least one intermediate layer of an insulating material on the signal-side surface and on a ground plane-side surface of the wafer;
(iii) depositing a metal conductor to form a ground plane on the ground plane-side surface of the wafer and to substantially fill the trenches formed at step (i);
(iv) depositing a conformal layer of insulating material to cover the signal-side surface, including the substantially filled trenches of metal conductor;
(v) removing material from surface of the conformal layer as required to make it substantially flat; and
(vi) bonding at least one cover board to the substantially flat surface.

Preferably, step (i) of the method further comprises forming one or more recesses in the wafer to accommodate electrical components. Preferably, at step (vi), the at least one cover board is bonded to the substantially flat surface under a vacuum.

BRIEF DESCRIPTION OF THE DRAWING FIGURES

Preferred embodiments of the present invention will now be described by way of example only and with reference to the accompanying drawings, of which:

FIGS. 2a-2m show a series of sectional views through part of a circuit board having entrenched transmission line conductors fabricated according to a preferred embodiment of the present invention;

DETAILED DESCRIPTION

While circuit boards according to preferred embodiments of the present invention to be described below are fabricated using silicon as the base substrate material, other types of high dielectric constant material may be used, for example alumina, sapphire, gallium arsenide or gallium nitride. Appropriate substitutes, as would be apparent to those or ordinary skill in such fabrication techniques, may be selected for the various deposition layers to be applied to the base substrate in constructing circuit boards and embedded transmission lines according to the present invention.

One of the problems in using hard substrates to make high frequency circuits having a circuit board and a cover board with interleaving transmission line conductors is that, when the boards are mated together, an air gap can be created between the mating surfaces which can lead to the generation of unwanted modes of signal propagation, severely degrading the electrical performance of the circuit. This problem does not arise with softer substrate materials as the substrates can deform under compression and heating to fill any gaps around conductors fabricated on the surfaces being mated. However, advantageously, hard substrate materials of the type suggested above generally have a high dielectric constant and enable much smaller circuits to be made than would be possible with softer substrate materials.

Figure 1:
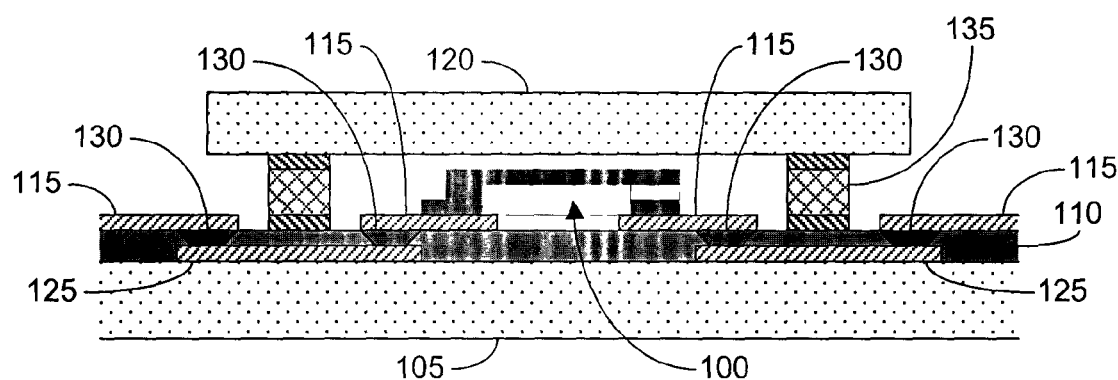
FIG. 1 shows sectional view of part of a prior art circuit board showing electrical connections to a packaged component in a high frequency circuit fabricated on a wafer of rigid material such as silicon.

One known technique for overcoming the problem of adequately packaging a component in a high frequency circuit is shown in FIG. 1.

Referring to FIG. 1 a sectional view is provided of a portion of a high frequency circuit showing a micro-electro-mechanical system (MEMS) component, in this example a switch 100, mounted on a circuit board comprising a base substrate material 105 and a layer 110 of dielectric material deposited on top. Metal conducting tracks 115 are formed over the surface of the dielectric material layer 110 to interconnect components, such as the switch 100, in the circuit. However, in order to provide a sealed package for the switch 100, a capping chip 120 needs to be bonded to the dielectric material layer 110 in a region surrounding the switch 100. If there were conducting metal tracks 115 passing over the region surrounding the switch 100 then it would be difficult to bond the capping chip to the dielectric material layer 110 without leaving gaps. To avoid this, the prior art arrangement of FIG. 1 provides short sections 125 of metal conductor within the dielectric material layer 110 to pass beneath the surface of the dielectric material layer 110 in the region intended for bonding the capping chip. These sections of metal conductor 125 are electrically connected to the conducting tracks 115 on the surface of the dielectric material layer 110 by means of metal vias 130. The capping chip 120 may therefore be bonded by means of a sealing ring 135 to a flat region of the dielectric material layer 110.

Whereas the prior art arrangement of FIG. 1 appears to have provided one solution to the problem of providing a good seal when bonding down a capping chip to package one or more components in a high frequency circuit, there are electrical performance penalties associated with the use of metal vias 130 in microwave and higher frequency circuits, and there is increased cost in fabricating circuit boards using that prior art technique.

According to preferred embodiments of the present invention an entire pattern of transmission line conductors required to link to and interconnect components in a circuit is embedded in a corresponding pattern of trenches beneath the finished surface of the circuit board so avoiding the need to use vias and at the same time enabling a very flat surface to be created. A similarly flat-faced cover board or a number of individual capping chips or cavitated lids may then be bonded on top of the circuit board without creating any air gaps between the two. Avoiding use of metal vias and other feed-through techniques to interconnect with components in the circuit maximizes electrical performance at microwave and higher frequencies in particular.

The entrenched transmission lines are fabricated using largely conventional multi-level damascene processes, as will be described below with reference to FIGS. 2 and 3, and can be extended to modern integrated circuit designs to achieve higher performance and a greater degree of miniaturisation. More detailed information relating to these conventional fabrication techniques can be found in Gardner J W, Varadan V K, Awadelkarim O O, "Microsensors MEMS and Smart Devices", Wiley 2001, ISBN 0471-86109X, and Rai-Choudhury R (Ed.), "MEMS and MOEMS Technology and Applications", SPIE 2000, ISBN 0-8194-3716-6.

For an integrated circuit application, a typical process to create a pattern of entrenched transmission line conductors would be to first entrench the passive transmission line pattern and concurrently create recesses into which any required functional components, e.g. passive components such as resistors and capacitors, semiconductor chips or so-called micro-electro-mechanical systems (MEMS) components comprising free-standing mechanical structures, would be embedded.

A preferred process for manufacturing a high frequency circuit comprising a circuit board and at least one cover board, the circuit board incorporating entrenched transmission line interconnections between circuit elements or devices, will now be described with reference to FIGS. 2a-2m. In FIGS. 2a-2m elements which have the same function are denoted by the same reference numbers and a detailed explanation thereto is omitted. The circuit comprises a circuit board carrying a pattern of conductors and, optionally, circuit elements of various types, and an unpatterned cover board which is eventually bonded to the circuit board. In the example to be described, a silicon substrate and silicon-based fabrication technique is used. However, the entrenched transmission line technique of the present invention may be readily applied to any other integrated circuit system, in particular one employing other hard substrate materials such as alumina, sapphire, gallium arsenide or gallium nitride. For each of these alternatives to a silicon substrate, the specific fabrication technique used would be tailored to the choice of base substrate material, as would be apparent to a person of ordinary skill in this field.

Figure 2A:
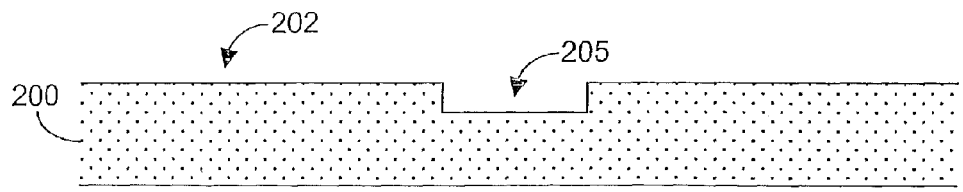

Referring to FIG. 2a, a section through a wafer 200 of high-resistivity base substrate material, preferably silicon, is shown having a signal-side surface 202 and a ground plane surface 203. One or more trenches 205 have been formed in the signal-side surface 202 of the wafer 200 in positions corresponding to the intended paths of transmission line conductors. Trenches 205, and any other recesses required to accommodate post-processed functional circuit components, may be formed in the signal-side surface 202 by any one of a number of known techniques, for example by chemical etching, reactive ion etching or laser ablation.

Figure 2B:
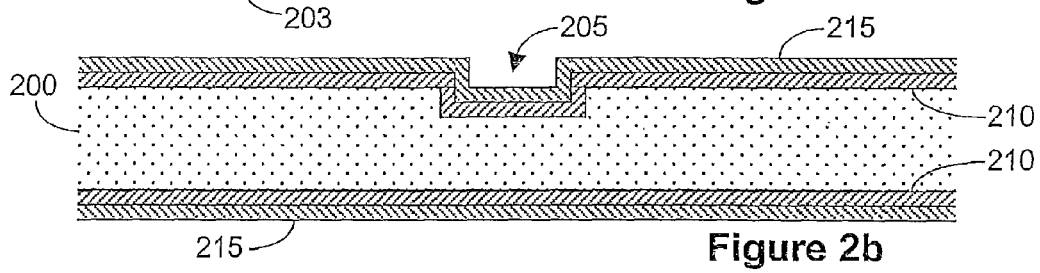

Referring to FIG. 2b, having formed the required pattern of trenches 205 in the wafer 200, a charge-balancing layer of polysilicon 210 is deposited to a thickness of approximately 0.6 μm on both the signal-side surface 202, including the inner surfaces of the trenches 205, and the ground plane surface 203 (FIG. 2a) of the wafer 200. A buffer layer 215 of silicon dioxide is then deposited to a thickness of approximately 0.2 μm to cover the charge-balancing layer 210, also on both sides of the wafer 200, to reduce current leakage. The charge-balancing layer of polysilicon 210 between the wafer 200 and the buffer layer 215 is known (see "Low Loss CPW Lines on Surface Stabilised High-Resistivity Silicon", H. S. Gamble et al., IEEE Microwave and Guided Wave Letters, Vol. 9 No 10 October 19) to cut down on one source of high frequency signal loss that might otherwise arise due to the presence of the buffer layer 215. FIG. 2b shows the result of having deposited the first two layers 210 and 215 of material.

Figure 2C:
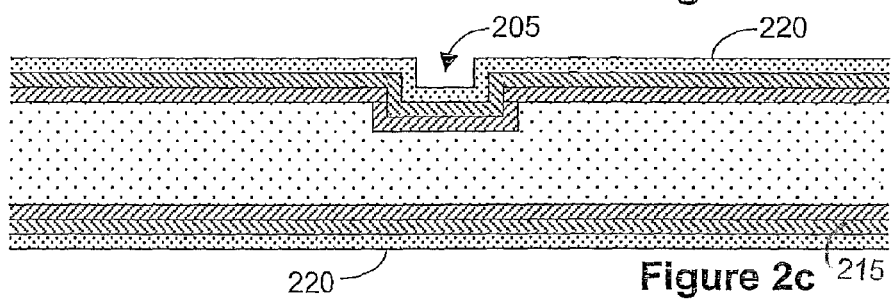
Figure 2D:
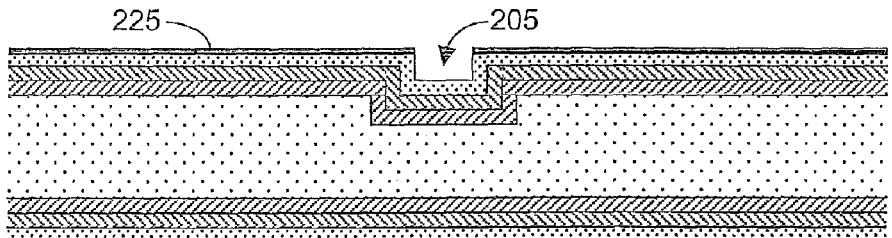
Figure 2E:
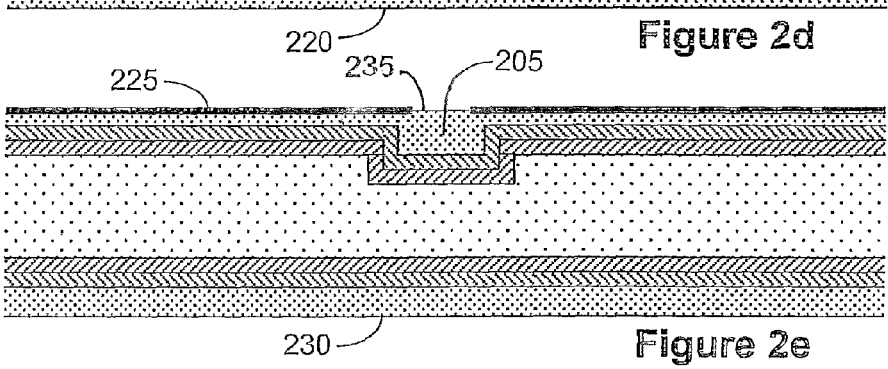

A so-called "seed layer" 220 of conductor material, preferably gold, is then sputtered over both the signal-side (202) and ground plane side (203), to cover the buffer layer 215 as shown in FIG. 2c. In practice, the seed layer 220 is very thin, of the order of one hundred nanometers in thickness. A layer 225 of photo-lithographic resist material is then deposited over the signal-side surface of the seed layer 220 to mask all but the trenches 205, as shown in FIG. 2d. With the photo-lithographic resist mask 225 in place, the trenches 205 are plated to fill them with gold up to a level just below the photo-lithographic resist layer 225, as shown in FIG. 2e, to form the basis of gold conductors. The ground plane surface is also plated with gold to cover the sputtered seed layer 220 up to a thickness, approximately 3 μm, required to provide a ground plane conductor layer 230. Plating techniques are likely to be less expensive in practice than sputtering techniques for depositing the layers 230, 235 of gold conductor onto the seed layer 220.

Figure 2F:
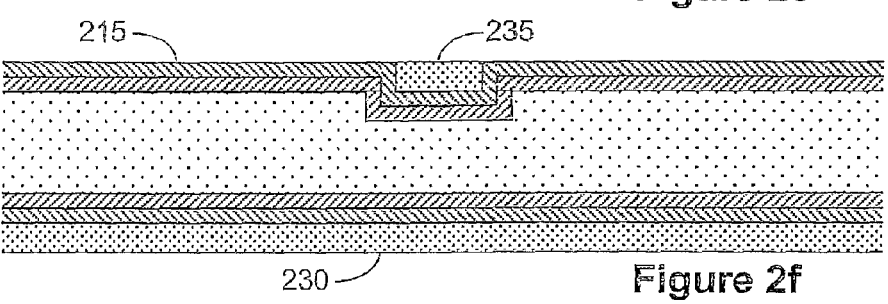

Referring to FIG. 2f, the resist layer 225, the gold seed layer 220 and optionally part of the buffer layer 215 as variously shown in FIGS. 2b-2e, where applicable, are then etched away from the signal-side surface of the circuit board to expose the silicon dioxide buffer layer 215 and the filled trenches of gold conductor 235. Having plated the trench with gold at the stage of FIG. 2e to a level just below that of the photo-lithographic resist, and due to the dissimilar materials, in this example silicon dioxide and gold, the result of the etching stage is a slightly uneven surface to the gold conductor 235. In practice, the surface of the gold conductor 235 after etching comprises a slight depression, possibly with slightly raised portions to either side. However, the degree of unevenness in the surface is very slight and is not shown in FIG. 2f.

Figure 2G:
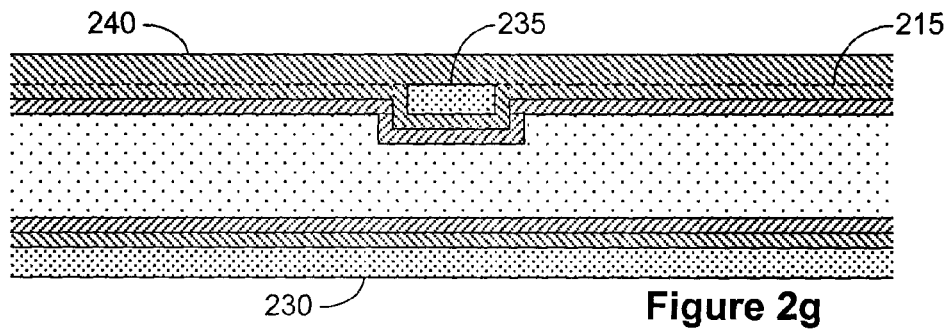
Figure 2H:
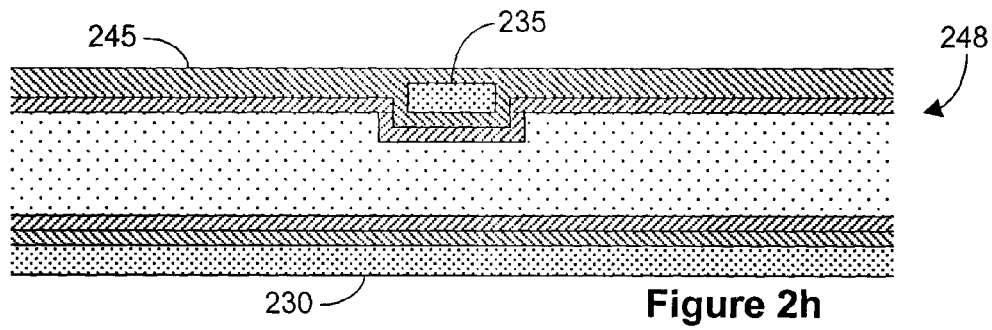

Referring to FIG. 2g, the buffer layer of silicon dioxide 215 on the signal-side surface of the board is increased in thickness through deposition to form a so-called "conformal" layer 240 of silicon dioxide designed to cover the gold conductors 235 and any unevenness thereto to at least the thickness required in the finished board, approximately 0.2 μm. The signal-side surface of silicon dioxide is then made substantially optically flat (245) using, for example, a conventional chemical-mechanical polishing technique, resulting in the finished circuit board 248 shown in FIG. 2h.

Figure 2J:
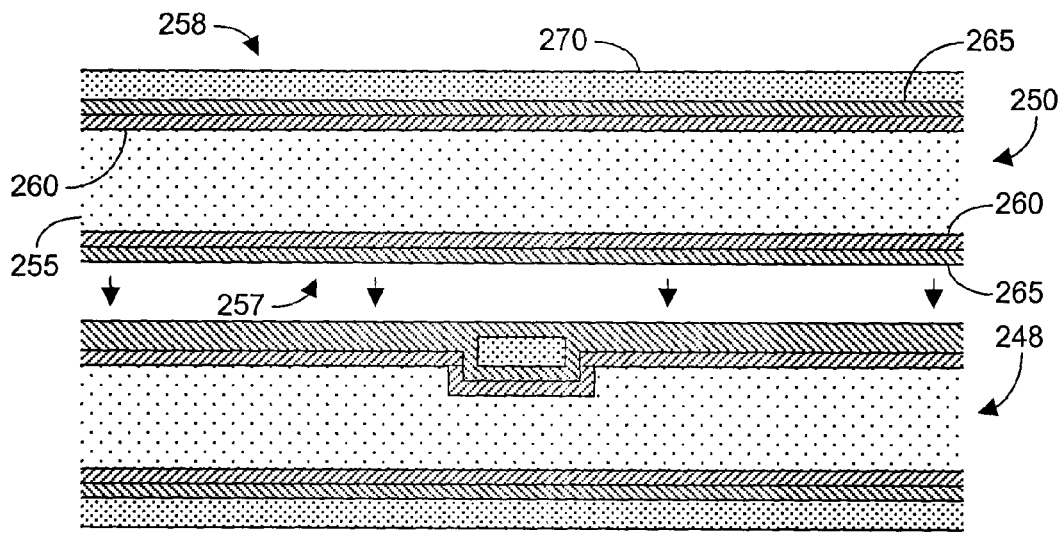

Referring to FIG. 2j, an unpatterned cover board 250 may be manufactured by means of a similar process to that described above for the circuit board 248. In particular a wafer 255 of the base substrate material, silicon, is selected having similar dimensions to the wafer 200 used for the circuit board 248, having a signal-side 257 and a ground plane side 258. A charge-balancing layer of polysilicon 260 is firstly deposited on each of the signal side 257 and ground plane side 258 surfaces of the wafer 255 followed by buffer layers 265 of silicon dioxide.

In common with the process step described above with reference to FIG. 2c, a seed layer is sputtered across the surface of the ground plane-side buffer layer 265, followed by a plating of gold to a thickness sufficient to form a ground plane conductor 270 similar to that (230) shown in FIG. 2e for the circuit board 248. Furthermore, in common with the process step described above with reference to FIG. 2g, the signal-side (257) silicon dioxide buffer layer 265 is then polished to a substantially optically flat surface using a conventional chemical-mechanical polishing technique, resulting in the finished cover board 250 shown in FIG. 2j.

Figure 2K:
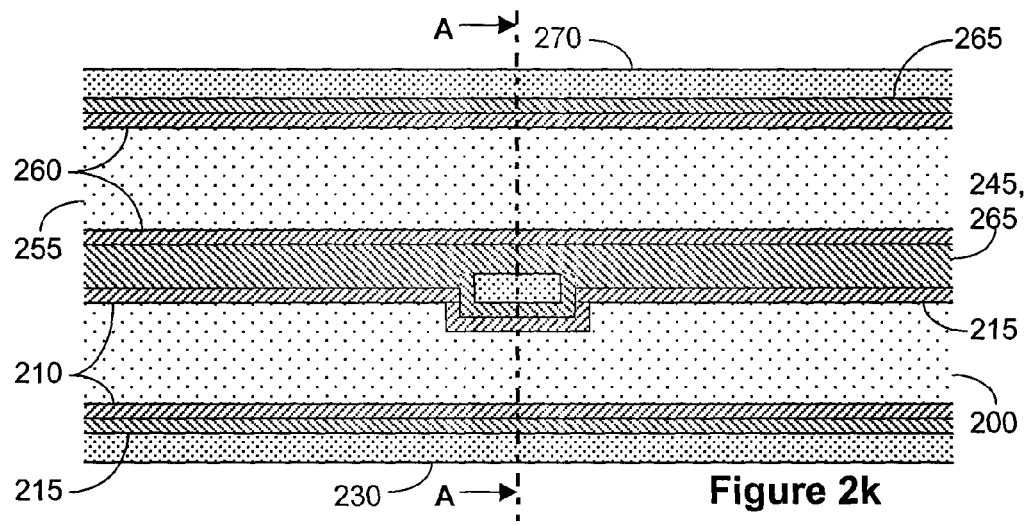
Figure 2M:
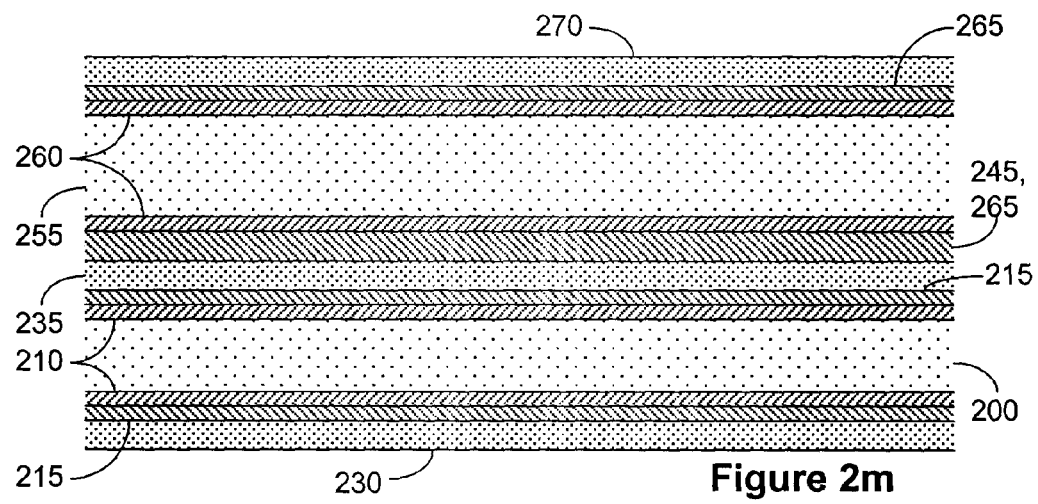

The two boards 248 and 250 are then bonded together, optically flat signal side to optically flat signal side, using an appropriate bonding technique, resulting in the completed circuit shown in FIGS. 2k and 2m. FIG. 2m shows a sectional view of the completed circuit taken through the plane A-A of FIG. 2k from the direction indicated. Conventional adhesive or glass frit bond-lines may be used to bond the boards together. With the signal-side surfaces being substantially optically flat, direct bonding techniques may be used to give improved results. No air gaps remain between the two signal-side surfaces when the boards are bonded together, as can arise in prior art arrangements. The advantage of a direct bond technique is that, with no intermediate adhesive layer, the bond-line, though of a slightly different dielectric constant, has essentially zero thickness, which minimises the effects on the electrical design characteristics and performance.

The manufacturing process described above with reference to FIGS. 2a-2m is particularly suited to boards carrying passive high frequency devices such as filters which may be fabricated at the same time and in the same plane as the entrenched conductors 235. However, other components may be accommodated on the board and interconnected by entrenched conductors of the present invention. If these components cannot be entirely buried within the circuit board 248, then suitable cavities may be formed in the signal-side surface 257 of the cover board 250 so that when the two boards are bonded together, the cavities accommodate any portions of components that protrude above the otherwise optically flat signal-side surface 245 of the circuit-side board 248.

Fabrication methods for MEMS components are well documented. The foregoing technique may be easily extended to include MEMS components in a series of post-processing steps to accommodate the MEMS component onto the circuit board surface. Although this may create raised surface features of a few microns, these may be accommodated by localised recesses in the cover board 250 which would then be easily bonded to the otherwise flat surface of the circuit board 248.

Figure 3A:
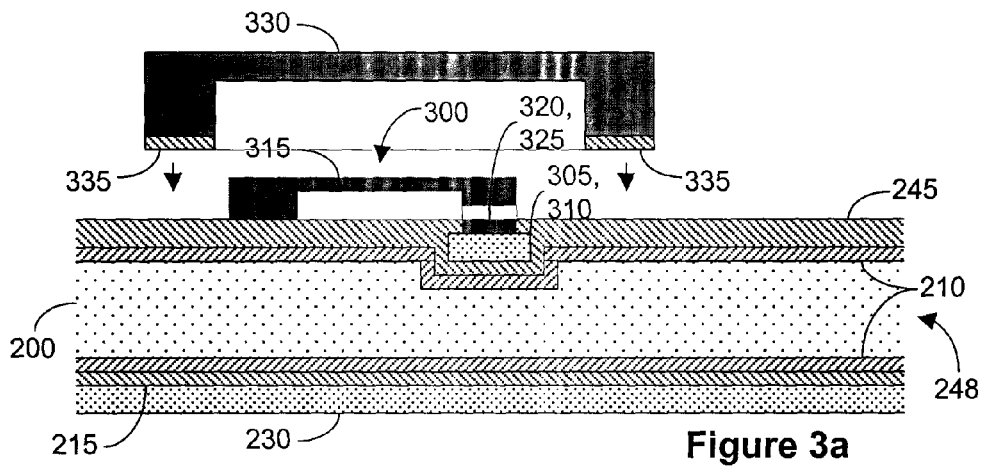
FIGS. 3a-3c show a series of sectional views through part of a circuit board showing an improved technique for packaging a component mounted on the circuit board fabricated according to a preferred embodiment of the present invention.
Figure 3B:
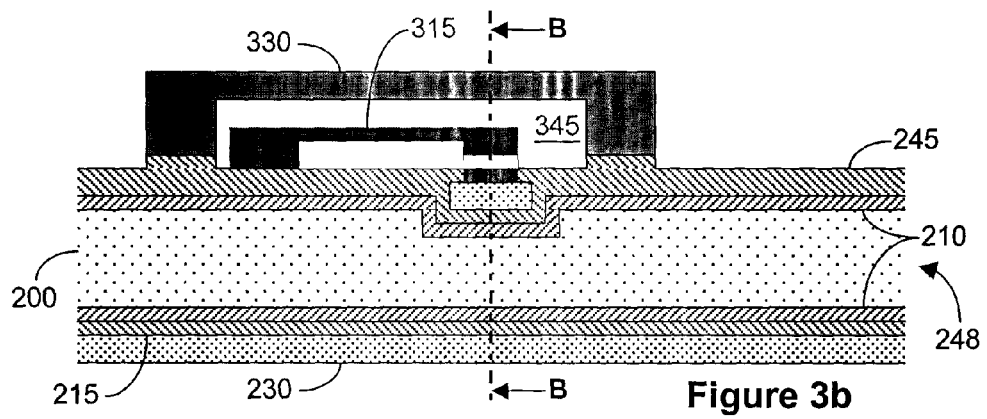
Figure 3C:
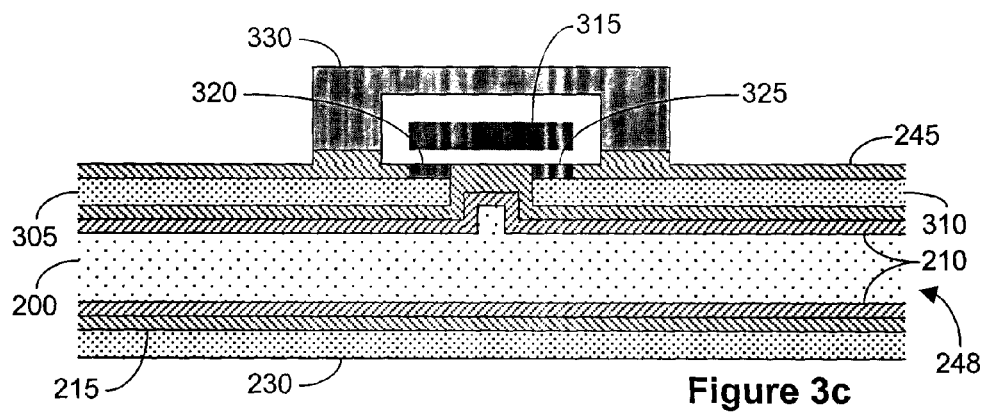

An arrangement will now be described with reference to FIGS. 3a-3c for packaging MEMS components mounted on or partially within a circuit board 248, taking advantage of the flat surface 245 that results from the use of entrenched transmission line interconnections according to preferred embodiments of the present invention. FIGS. 3a-3c provides three sectional views of an arrangement in which a MEMS switch is mounted on a circuit board 248 and is to be covered with a protective lid made, for example, from silicon. FIG. 3a shows a sectional view of the arrangement before the lid is fitted. FIG. 3b shows the same sectional view as in FIG. 3a but with the lid fitted. FIG. 3c shows a sectional view though the plane B-B of FIG. 3b from the direction indicated. In FIGS. 3a-3c elements which have the same function are denoted by the same reference numbers and a detailed explanation thereto is omitted.

Referring to FIGS. 3a-3c, a switch 300 FIG. 3a is shown mounted on a section of circuit board 248 and positioned to make a switchable connection between two sections of entrenched transmission line conductor 305, 310 FIG. 3a. The switch 300 FIG. 3a comprises a deformable arm portion 315 arranged to move into and out of a position of electrical connection with conducting pads 320, 325 (FIGS. 3a and 3b), bonded to sections 305, 310 of the entrenched conductors, or directly with the entrenched conductors 305, 310 themselves through access windows etched into the conformal/buffer layer 245. The conducting pads 320, 325 may be bonded to the conductors 305, 310 through such access windows. Alternatively, the conducting pads 320, 325 may have been formed at an additional gold plating step in the manufacturing process described above with reference to FIGS. 2a-2m.

The switch 300 (FIG. 3a) is to be encapsulated by means of a silicon lid 330 which has a layer of silicon dioxide 335 (FIG. 3a) deposited around the perimeter surface of the lid that will be bonded to the circuit board 248. The layer 335 is polished flat so that it may be bonded to the circuit board 248 without leaving air gaps. The great advantage of having used entrenched conductors 305, 310 according to the present invention to connect to the switch 300 or to any other component mounted on or within the circuit board 248 is that the region surrounding the component is flat, enabling the entire perimeter surface of the lid 330 to be bonded to the board 248. The lid 330 is bonded to the board 248 under a vacuum, so that no air remains in the sealed cavity 345 (FIG. 3b) under the lid 330, or by means of a low pressure back-fill gas technique.

In some prior art arrangements the interconnecting conductors would be lying on the surface of the circuit board 248 and the lid 330 would need to be bonded to the board 248 over the conductors, potentially leaving air gaps that degrade the performance of the circuit. In other prior art arrangements, rather than attempt to bond over conductors, a system of vias would need to be made through the circuit board or through an upper layer of the circuit board inside and outside each packaged component.

While FIGS. 3b and 3c shows a lid 330 enclosing a single component or small number of components by direct bonding onto the finished surface of the circuit board 248, an obvious extension is to enclose a complete sub-system by such a lid 330.

Whereas the foregoing detailed description of preferred embodiments of the present invention has focussed in particular on a circuit board having one or more high frequency components connected by means of entrenched transmission lines, the present invention may also be applied to boards carrying only one or more entrenched transmission line conductors without any other type of component being carried by the board. To this end, the present invention is also directed to an entrenched transmission line as such. Moreover, the present invention is intended to encompass variations to the preferred embodiments described and substitutions as would be apparent to a person of ordinary skill in the relevant art.

The invention claimed is:

1. A circuit board comprising:
  a wafer of a substantially rigid base substrate, the wafer including a signal-side surface and a ground plane-side surface, the signal-side surface having a pattern of trenches formed thereon that correspond to a planar pattern of transmission line conductors;

an intermediate layer of an insulating material on the signal-side and on the ground plane-side of the wafer;

a first metal conductor layer on the ground plane-side surface to form a ground plane;

a second metal conductor layer on the signal-side surface substantially filling the pattern of trenches to form the planar pattern of transmission line conductors;

a substantially flat conformal layer of insulating material that covers the second metal conductor layer on the signal-side surface including the substantially filled pattern of trenches forming the planar pattern of transmission line conductors; and a cover board bonded to the substantially flat conformal layer.

2. The high frequency circuit according to claim 1, further comprising an electrical component disposed on or within the conformal layer, the electrical component being electrically connected by means of the planar pattern of transmission line conductors.

3. The high frequency circuit according to claim 2, wherein the electrical component comprises a corresponding MEMS device.

4. The high frequency circuit according to claim 1, wherein electrical connection to an electrical component disposed on the surface of the conformal layer is made through an access window disposed in the conformal layer above a section of the planar pattern of transmission line conductors.

5. The high frequency circuit according to claim 1, wherein the cover board comprises a cavity arranged to accommodate an electrical component formed on the conformal layer.

6. The high frequency circuit according to claim 5, wherein the cavity in the cover board is arranged to cover the electrical component.

7. The high frequency circuit according to claim 1, wherein the cover board is bonded to the conformal layer by means of a direct bonding technique.

8. The high frequency circuit according to claim 1, wherein the wafer of a substantially rigid base substrate comprises silicon.

9. The high frequency circuit according to claim 1, wherein the cover board is bonded to the conformal layer by means of an adhesive.

10. A method of manufacturing a circuit board for use in a high frequency circuit, the method comprising the steps of:

(i) in a signal-side surface of a wafer of a substantially rigid base substrate dielectric material, forming a pattern of trenches corresponding to a planar pattern of transmission line conductors;

(ii) depositing at least one intermediate layer of an insulating material on the signal-side surface and on a ground plane-side surface of the wafer;

(iii) depositing a metal conductor to form a ground plane on the ground plane-side surface of the wafer and to substantially fill the trenches to form the planar pattern of transmission line conductors formed at step (i);

(iv) depositing a conformal layer of insulating material to cover the signal-side surface, including the substantially filled trenches of metal conductor;

(v) removing material from surface of the conformal layer as required to make the conformal layer substantially flat; and (vi) bonding at least one cover board to the substantially flat surface.

11. The method according to claim 10, wherein said base substrate material is silicon.

12. The method according to claim 11, wherein said at least one intermediate layer and said conformal layer comprise silicon dioxide.

13. The method according to claim 11, wherein said at least one intermediate layer further comprises a charge balancing layer of polysilicon deposited directly onto the base substrate material.

14. The method according to claim 10, wherein step (vi) is performed under a vacuum.

15. The method according to claim 10, wherein step (i) further comprises forming recesses within the wafer to accommodate one or more electrical components.

16. A circuit board comprising:

a wafer of a substantially rigid base substrate, the wafer including a signal-side surface and a ground plane-side surface, the signal-side surface having a pattern of trenches formed thereon that correspond to a planar pattern of transmission line conductors;

an intermediate layer of an insulating material on the signal-side and on the ground plane-side of the wafer;

a first metal conductor layer on the ground plane-side surface to form a ground plane;

a second metal conductor layer on the signal-side surface substantially filling the pattern of trenches to form the planar pattern of transmission line conductors;

a substantially flat conformal layer of insulating material that covers the second metal conductor layer on the signal-side surface including the substantially filled pattern of trenches forming the planar pattern of transmission line conductors;

an electrical component on the surface of the substantially flat conformal layer, the conformal layer having an access window formed therein above a section of the planar pattern of transmission line conductors through which electrical connection between the electrical component and the planar pattern of transmission line conductors is made; and a cover board bonded to the substantially flat conformal layer, the cover board comprising a cavity arranged to accommodate the electrical component.

* * * * *